(12) United States Patent
Fastow et al.

(10) Patent No.: US 6,654,285 B1
(45) Date of Patent: Nov. 25, 2003

(54) METHOD OF MATCHING CORE CELL AND REFERENCE CELL SOURCE RESISTANCES

(75) Inventors: Richard Fastow, Cupertino, CA (US); Jiang Li, San Jose, CA (US); Lee Cleveland, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 14 days.

(21) Appl. No.: 10/083,789

(22) Filed: Feb. 27, 2002

(51) Int. Cl.[7] .............................................. G11C 11/34

(52) U.S. Cl. ................................ 365/185.2; 365/185.22

(58) Field of Search ......................... 365/185.2, 185.22

(56) References Cited

U.S. PATENT DOCUMENTS 5,629,892 A  *  5/1997  Tang ....................... 365/185.2

* cited by examiner

*Primary Examiner*—M. Tran

(57) ABSTRACT

In a method of reading a memory cell of a memory cell array, electrical potentials are applied to a conductive structure connected to the drain, a conductive structure connected to the source, and the gate of the transistor of a cell to be read. Electrical potential are also applied to a conductive structure connected to the drain, a conductive structure connected to the source, and the gate of the transistor of a reference cell, providing current through the reference cell. The level of resistance to current through the reference cell is chosen by selecting the level of resistance in the conductive structure connected to the source of the transistor of the reference cell.

7 Claims, 5 Drawing Sheets

METHOD OF MATCHING CORE CELL AND REFERENCE CELL SOURCE RESISTANCES

BACKGROUND OF THE INVENTION

1. Technical Field

This invention relates generally to memory arrays, and more particularly, to a method of matching characteristics of core and reference cells of the array.

2. Background Art

FIG. 1 illustrates a portion of a NOR memory cell array 20. The array 20 includes individual memory cells C1, C2, C3, . . . C32 made up of respective MOS field effect transistors T1, T2, T3, . . . T32, the transistors including a source S, a drain D, a floating gate FG, and a control gate CG. Bit lines B0, B1, B2, . . . B7 and word lines W0, W1, W2, W3 are included, as is well known. The cells C1–C32 are connected in an army of rows 22, 24, 26, 28 and columns 30, 32, 34, 36, 38, 40, 42, 44, with the control gates CG of the cells in a row (for example row 24) being connected to a respective word line (W1) and the drains D of the cells in a column (for example column 38) being connected to a respective bit line (B4). The sources S of the cells in a column are connected together, and are connected to the sources S of the cells of other columns by conductive lines (one shown at 46). Approximately every 20 bit lines across the array 20, each conductive line 46 connects to a contact (two shown at 48, 50) to which a voltage is supplied, to in turn supply a voltage to the source S of each cell.

A cell of the array 20 can be programmed by applying programming voltage (for example 9–10 volts) to the control gate CG, approximately 5 volts to the bit line to which the drain D is connected, and applying a voltage Vss (for example ground) to the associated contacts 48, 50. These voltages cause hot electrons to be injected from the drain depletion region of the transistor of the cell into the floating gate FG. Upon removal of the programming voltages, the injected electrons are trapped in the floating gate FG and create a negative charge therein that increases the threshold of the cell to a value in excess of approximately 4 volts.

A cell can be read by applying a voltage of for example approximately 5 volts to the control gate CG, applying approximately 1 volt to the bit line to which the drain D is connected, and applying for example ground to the Vss contacts 48, 50, and sensing the bit line current. If a cell is programmed and the threshold voltage is relatively high (4 volts), the current through the transistor will be zero or relatively low. If the cell is not programmed or is erased, the threshold voltage will be relatively low (2 volts), the control gate voltage will enhance the channel, and the current through the transistor will be relatively high.

A cell can be erased in several ways. In one approach, applying a relatively high voltage, typically 12 volts, to the contacts 48, 50, grounding the control gate CG and allowing the drain D to float erases a cell. This causes the electrons that were injected into the floating gate during programming to undergo Fowler-Nordheim tunneling from the floating gate through the thin tunnel oxide layer to the source S. Applying a negative voltage on the order of −10 volts to the control gate CG, applying 5 V to the source S and allowing the drain D to float can also erase the cell.

During the read operation, the signal from the cell being read (the "selected cell" SC) is compared to the signal from a reference cell, which is part of a reference cell array 51 as shown in FIG. 2, which array 51 is of generally the same size and configuration as the array 20. Similar to the array 20 of FIG. 1, the reference cell array 51 includes individual reference cells RC1, RC2, RC3, . . . RC32 made up of respective MOS field effect transistors T1, T2, T3, . . . T32, the transistors including a source S, a drain D, a floating gate FG, and a control gate CG. Bit lines B0–B7 and word lines W0–W3 are included, all as is well known. The cells are connected in an array of rows 52, 54, 56, 58 and columns 60, 62, 64, 66, 68, 70, 72, 74, with the control gates CG of the cells in a row (for example row 54) being connected to a respective word line (W1) and the drains D of the cells in a column (for example column 66) being connected to a respective bit line (B3). The sources S of the cells in a column are connected together, and are connected to the sources S of the cells of other columns by conductive lines (one shown at 78). Approximately every 20 bit lines across the array 51, each conductive line 78 connects to a contact (two shown at 80, 82) to which a voltage is supplied, to in turn supply a voltage to the source S of each transistor.

During reading of a selected memory cell of the array 20, electrical potentials are supplied to the source S (by means of applying voltage Vss to the contacts 48, 50), the drain D and the control gate CG of the selected cell as described above. Simultaneously, like electrical potentials are supplied to the source S (by means of applying voltage Vss to the contacts 80, 82), the drain D and the control gate CG of a reference cell of the array 20 (FIG. 2). The reference cells are fabricated so that when a memory cell of the array and a reference cell are simultaneously addressed, the addressed reference cell provides an output signal the level of which is generally between the levels of (i) the output signal of a programmed selected cell and (ii) the output signal of an erased selected cell. The output signals of the selected cell SC and reference cell RC are provided to a sense amplifier 84 (FIG. 3), and based on a comparison of the signals from the reference cell RC and the selected cell SC supplied to the sense amplifier 84, the sense amplifier 84 determines if the selected memory cell SC stores a logic 1 or a logic 0.

Again referring to FIG. 2, it will be noted that there is a resistance between each contact 80, 82 and the source S of each reference cell, the level of the resistance being substantially proportional to the distance from that reference cell to its associated contacts 80, 82. For example, for a reference cell RC13 positioned substantially midway between the Vss contacts 80, 82, the resistance between the source S of the reference cell RC13 and the contact 80 is 4R (four resistive units, i.e., four resistors 86, each with resistance R, in series), while the resistance between the source S of the reference cell RC13 and the contact 82 is also 4R (four resistive units, i.e., four resistors 86 each with resistance R, in series). During the read operation, this provides an overall resistance $R_{rc}$ between the source S of the reference cell RC13 and the Vss contacts 80, 82 of:

$$\frac{1}{R_{rc}} = \frac{1}{4R} + \frac{1}{4R}$$
$$= \frac{1}{2R}$$
$$R_{rc} = 2R$$

Referring to FIG. 1, if the selected cell is also positioned substantially midway between the Vss contacts 48, 50, the resistance between the source S of the selected cell and its associated contacts 48, 50 substantially matches up with the resistance for the reference cell RC13 of the reference cell array 51. For example, for a selected cell C13 positioned substantially midway between the contacts 48, 50, the resistance between the source S of the selected cell C13 and the contact 48 is 4R (four resistive units, i.e., four resistors 86 each with resistance R, in series), while the resistance between the source S of the selected cell C13 and the contact 50 is also 4R (four resistive units, i.e., four resistors 86 each with resistance R, in series). During the read operation described above, this provides an overall resistance $R_{sc1}$ between the source S of the selected cell C13 and the Vss contacts 48, 50:

$$\frac{1}{R_{sc1}} = \frac{1}{4R} + \frac{1}{4R}$$

$$= \frac{1}{2R}$$

$$R_{sc1} = 2R$$

However, if the selected cell is positioned closer to one Vss contact 48, 50 than the other, i.e., closer to an edge of the array 20, the resistance between the source S of the selected cell and its associated contacts 48, 50 is substantially different from that of the reference cell RC13 described above. For example, during the read operation, while the resistance between the source S of the reference cell RC13 and the contacts 80, 82 is 2R, the resistance $R_{sc2}$ between the source S of the selected cell C16 (positioned close to an edge of the array 20) and the Vss contacts 48, 50 is:

$$\frac{1}{R_{sc2}} = \frac{1}{R} + \frac{1}{7R}$$

$$\frac{1}{R_{sc2}} = \frac{7}{7R} + \frac{1}{7R} = \frac{8}{7R}$$

$$8R_{sc2} = 7R$$

$$R_{sc2} = \frac{7R}{8} = .875R$$

which is quite different from 2R resistance between the source S of the reference cell RC13 and its associated contacts 80, 82. While the reference cell RC13 is well matched to a selected cell (C13) which is positioned substantially midway between contacts 48, 50 and provides a level of output signal which is substantially midway between the levels of (i) the output signal of a selected cell in its programmed state and (ii) the output signal of the selected cell in its erased state, this reference cell RC13 is not well matched to a selected cell (C16) which is near an edge of the array 20, i.e., which is substantially closer to one contact (48) than the other contact (50), in that the reference cell C13 does not provide an output signal the level of which is substantially midway between the levels of (i) the output signal of a selected cell in its programmed state and (ii) the output signal of the selected cell in its erased state. This is so because the resistance between each selected cell and the associated contacts 48, 50 may be different, while of course the resistance between the reference cell RC13 and its associated contacts 80, 82 remains the same, independent of which of the cells to be read is selected. Thus, the sense amplifier 86 may have difficulty in determining the state of the selected cell, i.e., whether such selected cell is in a programmed or erased state.

Therefore, what is needed is a method for improving the matching of source to Vss contact resistance of a selected cell and a reference cell.

DISCLOSURE OF THE INVENTION

In the present method of reading a memory cell of a memory cell array, electrical potentials are applied to a conductive structure connected to the drain, a conductive structure connected to the source, and the gate of the transistor of a cell to be read. Furthermore, electrical potentials are applied to a conductive structure connected to the drain, a conductive structure connected to the source, and the gate of the transistor of a reference cell, providing current through the reference cell. The level of resistance to current through the reference cell is selected from a plurality of levels of resistance.

The present invention is better understood upon consideration of the detailed description below, in conjunction with the accompanying drawings. As will become readily apparent to those skilled in the art from the following description, there is shown and described an embodiment of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of an illustrative embodiment when read in conjunction with the accompanying drawings, wherein:

BEST MODE(S) FOR CARRYING OUT THE INVENTION

Reference is now made in detail to a specific embodiment of the present invention which illustrates the best mode presently contemplated by the inventors for practicing the invention.

Figure 1:
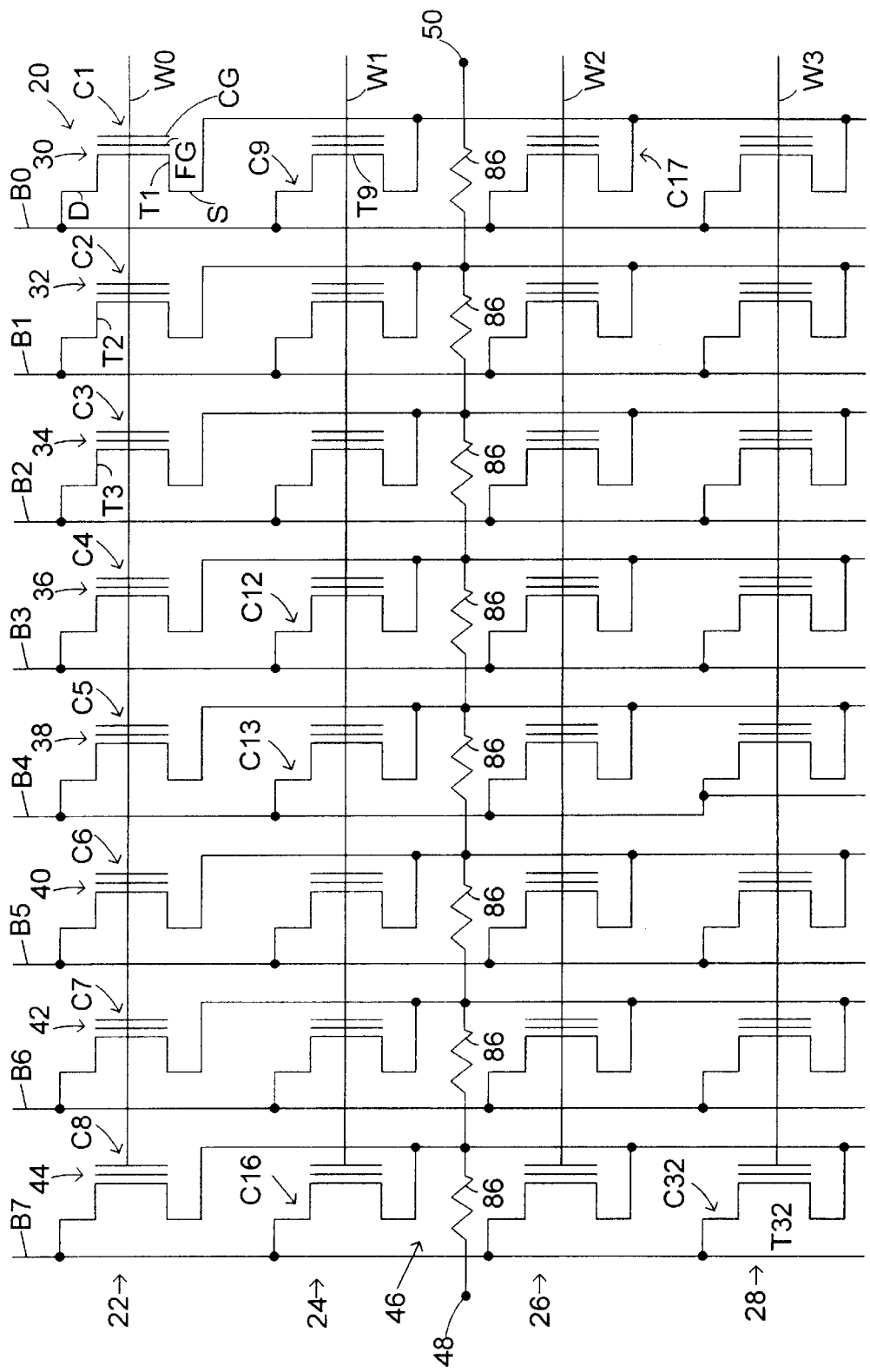
FIG. 1 is a schematic view of a portion of a memory cell array, showing cells therein to be written, read and erased, in accordance with the prior art.
Figure 2:
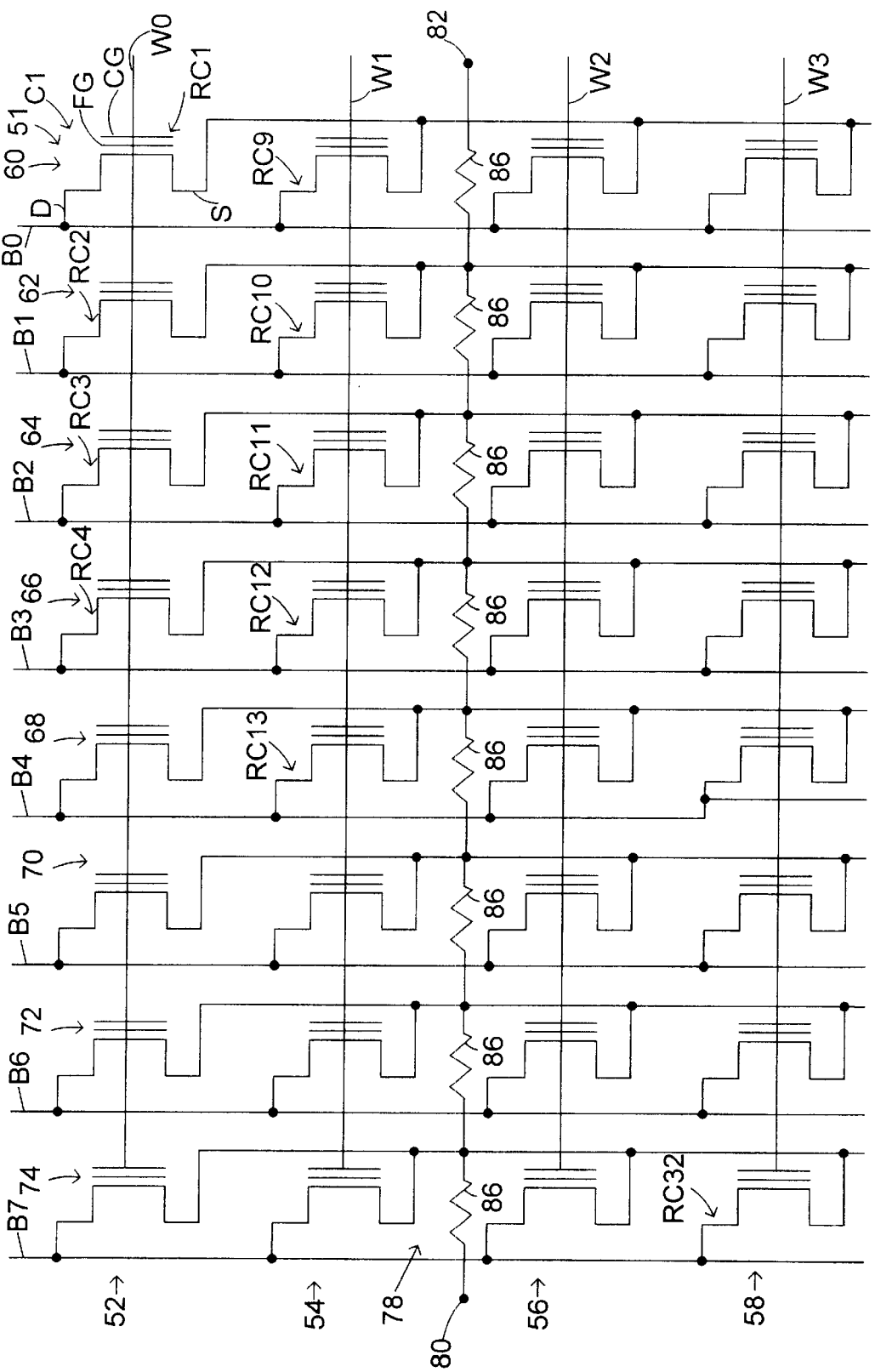
FIG. 2 is a schematic view of a portion of a reference cell array, showing reference cells therein, in accordance with the prior art.
Figure 3:
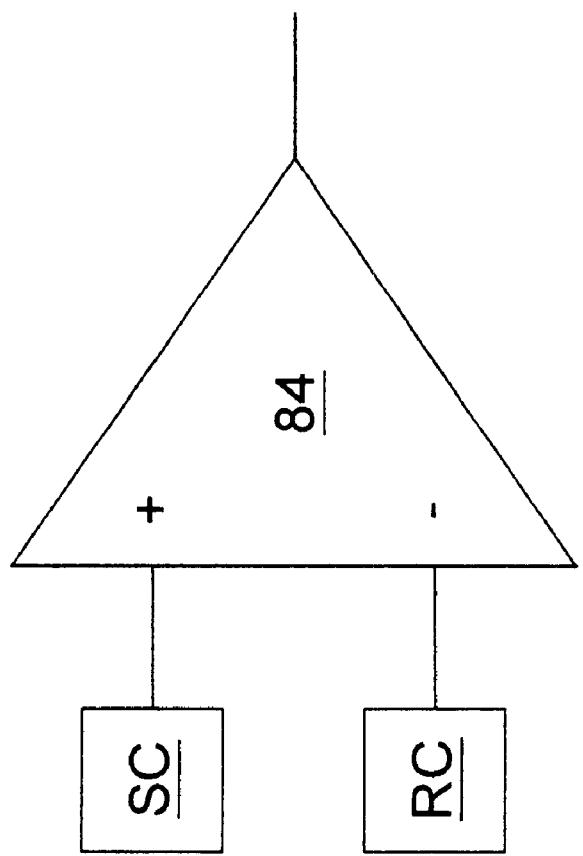
FIG. 3 is a schematic view showing the configuration of the differential amplifier used with the array portions of FIGS. 1 and 2.
Figure 4:
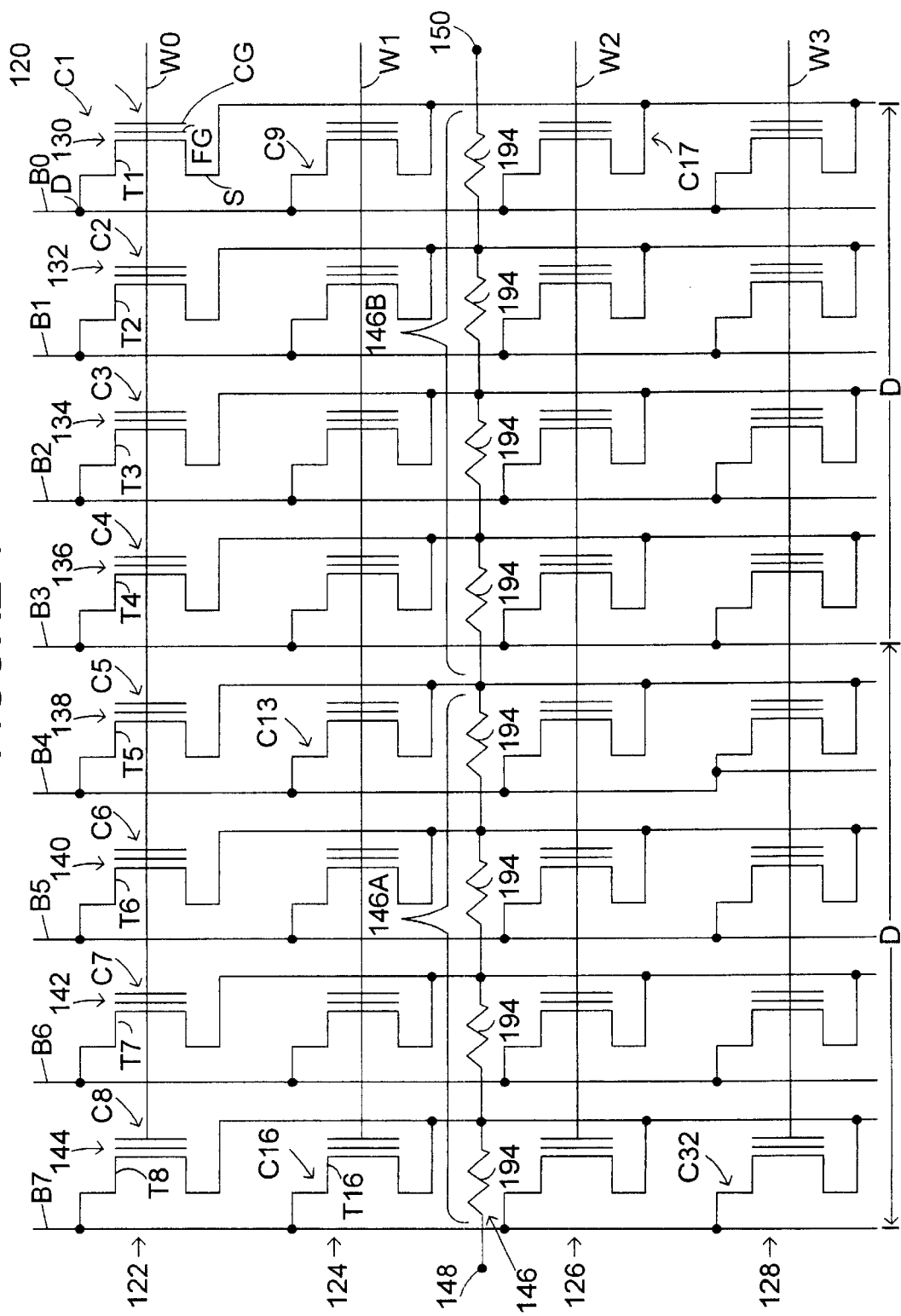
FIG. 4 is a schematic view of a portion of a memory cell array used in the present method, showing cells therein to be written, read and erased.

FIG. 4, similar to FIG. 1, illustrates a portion of a NOR memory cell array 120. The array 120 includes individual memory cells C1, C2, C3, . . . C32 made up of respective MOS field effect transistors T1, T2, T3, . . . T32, the transistors including a source S, a drain D, a floating gate FG, and a control gate CG. Bit lines B0–B7 and word lines W0–W3 are included, as is well known. The cells C1–C32 are connected in an array of rows 122, 124, 126, 128 and columns 130, 132, 134, 136, 138, 140, 142, 144, with the control gates CG of the cells in a row (for example row 124)

being connected to a respective word line (W1) and the drains D of the cells in the column (for example column 138) being connected to a respective bit line (B4). The sources S of the cells in a column are connected together, and are connected to the sources S of the cells of other columns by conductive lines (one shown at 146). Approximately every 20 bit lines across the array 120, each conductive line 146 connects to a contact (two shown at 148, 150) to which a voltage is supplied, to in turn supply a voltage to the source S of each cell.

It will be seen that the transistor of each memory cell has a conductive structure connected to the drain D thereof, a conductive structure connected to the source S thereof, and a word line connected to the control gate CG (for example, the transistor T13 of memory cell C13 has conductive structure bit line B4 connected to the drain D, a conductive structure in the form of conductive line 146 connected to the source S, and word line W1 connected to the control gate CG). As described above, electrical potentials are applied to the drain D, source S and control gate CG of the transistor of the memory cell to be read, by means of electrical potentials applied to the bit line connected to the drain D, the conductive structure connected to the source S (by applying Vss to the contacts 148, 150), and the word line connected to the control gate CG. As also described above, depending on how a cell is programmed, the current through the transistor of the cell will be on the one hand zero or relatively low, or on the other hand relatively high.

Figure 6:
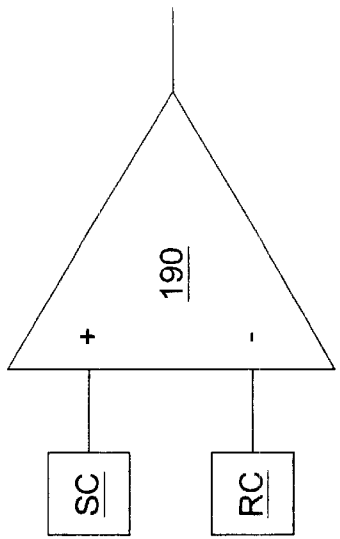
FIG. 6 is a schematic view showing the configuration of the differential amplifier used with the array portions of FIGS. 4 and 5.
Figure 5:
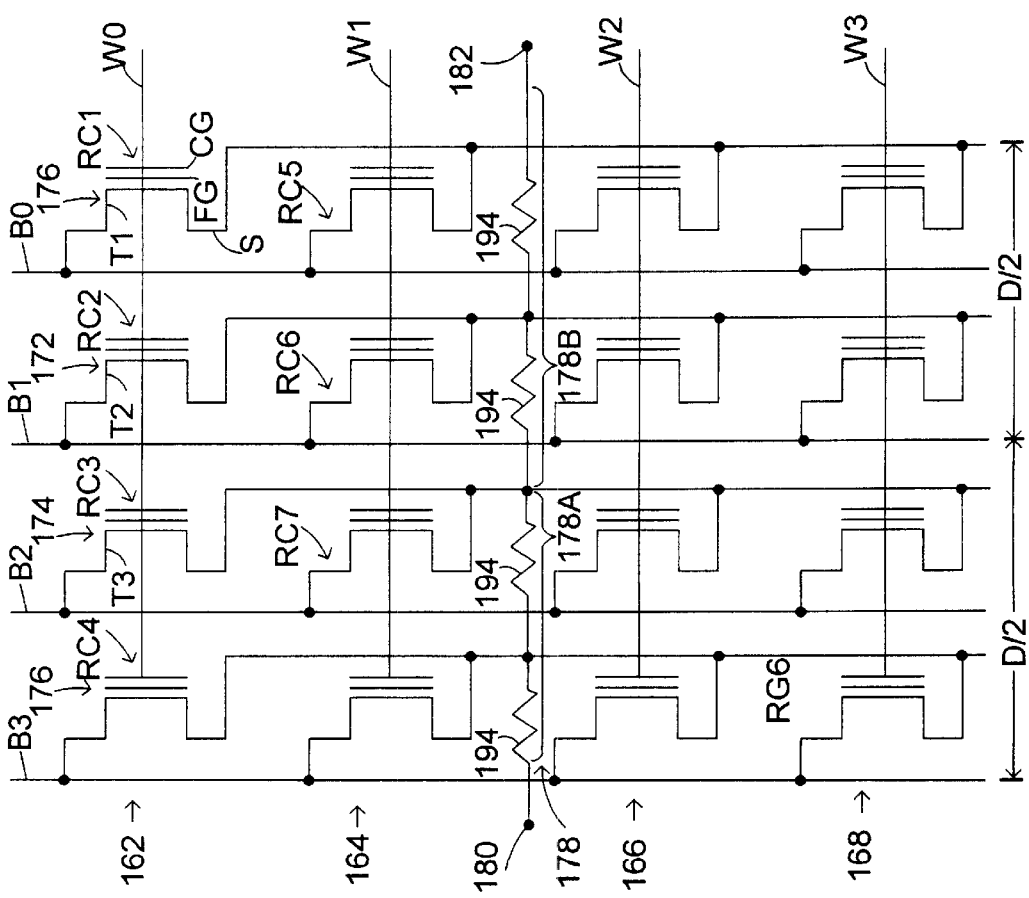
FIG. 5 is a schematic view of a portion of a reference cell array used in the present method, showing reference cells therein.

FIG. 5 illustrates an array 160 of reference cells. Similar to the array 120 of FIG. 1, the reference cell array 160 includes individual cells RC1, RC2, RC3, ... .RC16, made up of respective MOS field effect transistors T1, T2, T3, ... T16, the transistors including a source S, a drain D, a floating gate FG, and a control gate CG. Bit lines B0–B3 and word lines W0–W3 are included, all as is well known. The cells are connected in an array of rows 162, 164, 166, 168 and columns 170, 172, 174, 176, with the control gates CG of the cells in a row (for example row 164) being connected to a respective word line (W1) and the drains D of the cells in a column (for example column 174) being connected to a respective bit line (B3). The sources S of the cells in a column are connected together, and are connected to the sources S of the cells of other columns by conductive lines (one shown at 178). Approximately every 10 bit lines across the array 160, each conductive line connects to a contact (two shown at 180, 182) to which a voltage is supplied, to in turn supply a voltage to the source S of each transistor. The reference cells are fabricated so that when a memory cell of the array 120 and a reference cell of the array 160 are simultaneously addressed, the addressed reference cell provides an output signal the level of which is generally midway between the levels of (i) the output signal of a programmed selected cell and (ii) the output signal of an erased selected cell. The output signals of the selected cell SC and reference cell RC are provided to a sense amplifier 190 (FIG. 6), and based on a comparison of the signals from the reference cell RC and the selected cell SC supplied to the sense amplifier 190, the sense amplifier 190 determines if the selected memory cell SC stores a logic 1 or a logic 0.

It will be seen that the transistor of each reference cell has a conductive structure connected to the drain D thereof, a conductive structure connected to the source S thereof, and a word line connected to the control gate (for example, the transistor T7 of reference cell RC7 has conductive structure bit line B2 connected to the drain D, a conductive structure in the form of conductive line 178 connected to the source S, and word line W1 connected to the control gate CG). As described above, electrical potentials are applied to the drain D, source S and control gate CG of the transistor of the chosen reference cell, by means of electrical potentials applied respectively to the bit line connected to the drain D, the conductive structure connected to the source S (by applying electrical potential to the contacts 180, 182), and the word line connected to the control gate.

In the embodiment shown in FIGS. 4 and 5, the distance from the center of the array 160 of reference cells to each contact 180, 182 associated therewith is chosen to be approximately one-half the distance from the center of the array 120 of memory cells to each contact 148, 150 associated therewith. That is, for example, the distance from the memory cell C13 substantially at the center of the array 120 of memory cells to the contact 148 is D, and the distance from that memory cell C13 to the other contact 150 is also D. Meanwhile, the distance from the reference cell RC7 substantially at the center of the array 160 of reference cells to the contact 180 is approximately D/2, and the distance from that reference cell RC7 to the other contact 182 is also approximately D/2.

Assuming selection of, for example, a reference cell RC7 near the center of the array 160 to be used during the read operation of a memory cell, as noted above, that reference cell RC7 is connected to the contacts 180, 182 by conductive line 178 including portion 178A of the conductive line 178 connecting the source S of the cell RC7 with the contact 180 and portion 178B of the conductive line 178 connecting the source S of the cell RC7 with the contact 182. It will be noted that there is a resistance between each contact 180, 182 and the source S of the selected reference cell, the level of resistance being substantially proportional to the distance from that contact to the reference cell. For example, for a reference cell RC7 positioned substantially midway between the contacts 180, 182, the resistance between the source S of the reference cell RC7 and the contact 180 is 2R (two resistive units, i.e., two resistors 194, each with resistance R, in series), while the resistance between the source S of the reference cell RC7 and the contact 182 is also 2R (2 resistive units, i.e., 2 resistors 194 each with resistance R, in series). During the read operation, with electrical potential Vss applied to both contacts 180, 182, this provides an overall resistance $R_{rc1}$ between the source S of the reference cell RC7 and the contacts 180,182:

$$\frac{1}{R_{rc1}} = \frac{1}{2R} + \frac{1}{2R} = \frac{2}{2R} = \frac{1}{R}$$

$$R_{rc1} = R$$

However, during such read operation, if electrical potential Vss is applied only to one contract, for example contact 180, and no electrical potential is applied to contact 182, the overall resistance of the conductive structure between the source S of the reference cell RC7 and the contacts 180, 182 is:

$$R_{rc2} = 2R$$

Assuming now that a memory cell C13, near the center of the array 120, positioned substantially midway between the Vss contacts 148, 150 is chosen for reading, that memory cell C13 is connected to the contacts 148, 150 by conductive line 146 including portion 146A of the conductive line 146 connecting the source S of the cell C13 with the Vss contact 148 and portion 146B of the conductive line 146 connecting the source S of the cell C13 with the Vss contact 150. For a selected cell C13 substantially midway between the Vss contacts 148, 150 the resistance between the source S of the selected cell C13 and the contact is 4R (four resistive units, i.e., four resistors 194 each with resistance R, in series), while the resistance between the source S of the selected cell C13 and the contact 150 is 4R (four resistive units, i.e., four resistors each with resistance R, in series). During the read operation, this provides an overall resistance $R_{sc1}$ between the source S of the selected cell C13 and the Vss contacts:

$$\frac{1}{R_{sc1}} = \frac{1}{4R} + \frac{1}{4R}$$
$$= \frac{1}{2R}$$
$$R_{sc1} = 2R$$

In this situation, a substantial match to this resistance can be achieved for the reference cell RC7 by applying electrical potential Vss to only one of the contacts 180,182, with no electrical potential being applied to the other contact. As described above, this results in a resistance between the source S of the reference cell RC7 and the contacts 180, 182 of 2R, substantially matching that of the memory cell C13 to be read.

However, if the selected cell is positioned closer to one Vss contact than another, the resistance between the source S of the selected cell and its associated Vss contacts 148, 150 is substantially different from that of the reference cell RC7 in the state above. For example, while the resistance between the source S of the reference cell RC7 and the contacts is 2R in that state, the resistance $R_{sc2}$ between the source S of the selected cell C16 (close to the edge of the array 120) and the Vss contacts 148, 150 is:

$$\frac{1}{R_{sc2}} = \frac{1}{R} + \frac{1}{7R}$$
$$\frac{1}{R_{sc2}} = \frac{7}{7R} + \frac{1}{7R} = \frac{8}{7R}$$
$$8R_{sc2} = 7R$$
$$R_{sc2} = \frac{7R}{8} = .875R$$

which is quite different from 2R resistance described above between the source S of the reference cell RC7 and its associated contacts 180, 182.

In this situation, a substantial match to this resistance can be achieved for the reference cell RC7 by applying electrical potential Vss to both contacts 180, 182. As described above, during the read operation, this results in a resistance between the source S of the reference cell RC7 and contacts 180,182 of R, substantially matching the corresponding resistance of the memory cell C16 being read.

Similar to the above description, the output signals of the selected cell SC and reference cell RC are provided to a sense amplifier 190, and based on a comparison of the signals from the reference cell RC and the selected cell SC so applied to the sense 190 amplifier, the sense amplifier 190 determines if the selected memory cell SC stores a logic 1 or a logic 0.

It will be seen that a substantial matching of resistance to current through a selected cell and a reference cell can be achieved by selecting the level of resistance (from a plurality of levels thereof) to current through the reference cell. This is achieved by selecting the level of resistance in the conductive structure connected to the source of the reference cell, which selection in turn is dependent on the positioning of the memory cell to be read within its array. That is, for a memory cell to be read which is positioned near the center of its array, a relatively greater level of resistance to current through the reference cell is selected, while for a memory cell to be read which is positioned near an edge of its array, a relatively lower level of resistance to current through the reference cell is selected. This is achieved by selecting the number of resistors of a plurality thereof as part of the conductive structure connected to the source of the reference cell.

The foregoing description of the embodiment of the invention has been presented for purposes of illustration and description. It is not intended to be exhaustive or to limit the invention to the precise form disclosed. Other modifications or variations are possible in light of the above teachings. The embodiment was chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method of reading a memory cell of a memory cell array comprising:
    applying electrical potentials to a conductive structure connected to the drain, a conductive structure connected to the source, and the gate of the transistor of a memory cell to be read;
    applying electrical potentials to a conductive structure connected to the drain, a conductive structure connected to the source, and the gate of a transistor of a reference cell to provide a current through the reference cell; and
    selecting the level of resistance, from a plurality of levels thereof, to current through the reference cell;
    wherein the step of selecting the level of resistance to current through the reference cell comprises selecting the level of resistance in at least one of (i) the conductive structure connected to the drain of the reference cell and (ii) the conductive structure connected to the source of the reference cell.

2. The method of claim 1 wherein the step of selecting the level of resistance to current through the reference cell comprises selecting the level of resistance in the conductive structure connected to the source of the reference cell.

3. The method of claim 2 and further comprising the step of selecting the level of resistance to current through the reference cell depending on the position of the memory cell to be read within the memory cell array.

4. The method of claim 3 and further comprising the steps of selecting a relatively greater level of resistance to current through the reference cell when the memory cell to be read is positioned near the center of the memory cell array, and selecting a relatively lower level of resistance to current through the reference cell when the memory cell to be read is positioned near an edge of the memory cell array.

5. The method of claim 2 and further comprising the step of providing a plurality of resistors as part of the conductive structure connected to the source of the reference cell.

6. The method of claim 5 wherein the step of selecting the level of resistance from a plurality of levels thereof comprises selecting the number of resistors of the plurality thereof through which reference cell current flows.

7. A method of reading a memory cell of a memory cell array comprising:

applying electrical potentials to a conductive structure connected to the drain, a conductive structure connected to the source, and the gate of the transistor of a memory cell to be read;

applying electrical potentials to a conductive structure connected to the drain, a conductive structure connected to the source, and the gate of a transistor of a reference cell to provide a current through the reference cell; and selecting the level of resistance, from a plurality of levels thereof, to current through the reference cell;

and further comprising the step of selecting the level of resistance to current through the reference cell depending on the position of the memory cell to be read within the memory cell array.

* * * * *